United States Patent

Straub et al.

[11] Patent Number: 6,000,597
[45] Date of Patent: Dec. 14, 1999

[54] MOLTEN SOLDER DISPENSING SYSTEM

[75] Inventors: Marc Alan Straub, Dearborn Heights; Frank Burke DiPiazza, Highland; Vivek Amir Jairazbhoy, Farmington Hills; Lakhi Nandial Goenka, Ann Arbor; Randy Claude Stevenson, Saline, all of Mich.

[73] Assignee: Ford Motor Company, Dearborn, Mich.

[21] Appl. No.: 09/014,878

[22] Filed: Jan. 28, 1998

Related U.S. Application Data

[62] Division of application No. 08/649,750, May 15, 1996, Pat. No. 5,746,368.

[51] Int. Cl.⁶ ..................... B23K 3/06
[52] U.S. Cl. ............ 228/33; 228/256; 222/591; 239/590.5
[58] Field of Search ............... 228/33, 37, 254, 228/256, 257, 260; 222/591, 603; 164/437; 239/590.5, 600

[56] References Cited

U.S. PATENT DOCUMENTS

| | | | |
|---|---|---|---|
| 1,760,519 | 5/1930 | Palmer . | |
| 1,906,225 | 5/1933 | Dupau . | |
| 2,780,712 | 2/1957 | Thomas . | |
| 3,222,776 | 12/1965 | Kawecki . | |
| 3,332,474 | 7/1967 | Sickbert | 164/437 |
| 3,358,897 | 12/1967 | Christensen . | |
| 3,408,059 | 10/1968 | Hornak | 164/437 |
| 3,423,029 | 1/1969 | Demaison | 239/590 |
| 4,364,067 | 12/1982 | Koto et al. . | |
| 4,546,815 | 10/1985 | Liebermann et al. | 164/463 |
| 4,603,727 | 8/1986 | Hsu | 164/133 |
| 4,743,465 | 5/1988 | Saeki et al. . | |
| 4,898,117 | 2/1990 | Ledermann et al. . | |
| 4,934,309 | 6/1990 | Ledermann et al. . | |
| 5,042,708 | 8/1991 | Ledermann et al. . | |
| 5,065,932 | 11/1991 | Hayden et al. . | |
| 5,104,689 | 4/1992 | Hayden et al. . | |
| 5,176,312 | 1/1993 | Lowenthal . | |
| 5,238,176 | 8/1993 | Nishimura . | |
| 5,244,143 | 9/1993 | Ference et al. . | |
| 5,261,611 | 11/1993 | Huxford . | |
| 5,266,113 | 11/1993 | Konno . | |
| 5,364,011 | 11/1994 | Baker et al. . | |
| 5,377,961 | 1/1995 | Smith et al. . | |
| 5,381,946 | 1/1995 | Koopman et al. . | |
| 5,571,440 | 11/1996 | Eckert | 222/594 |
| 5,897,062 | 4/1999 | Enomoto et al. | 239/590 |

FOREIGN PATENT DOCUMENTS 60-92072 of 1985 Japan .
1249163 of 1989 Japan .

*Primary Examiner*—Samuel M. Heinrich
*Attorney, Agent, or Firm*—Joseph W. Malleck; Roger L. May

[57] ABSTRACT

An apparatus for dispensing solder includes a nozzle body having a plurality of flow channels formed therein. Each flow channel includes an inlet end and a dispenser end for dispensing solder. The nozzle body forms a nipple surrounding each dispenser end, and the nozzle body further forms a shielding chamber in communication with each dispenser end for protecting the respective nipple, and optionally providing flow of inerting gas and/or excluding ambient oxygen from the soldering area. The nozzle bodies comprise micro-machined silicon. Various flow channel configurations are provided for improved flow characteristics.

1 Claim, 6 Drawing Sheets

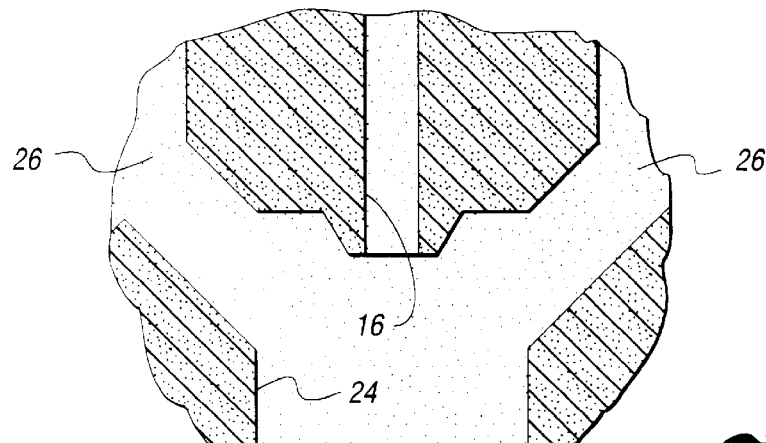
Fig. 7
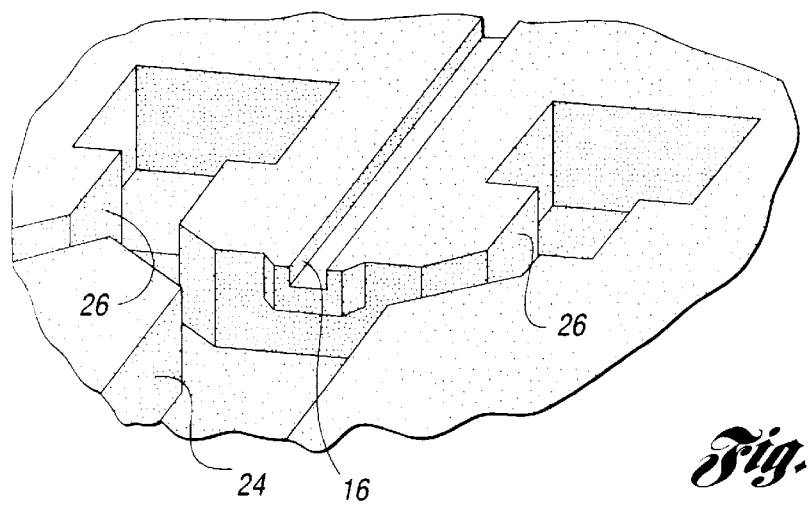
Fig. 8
Fig. 9
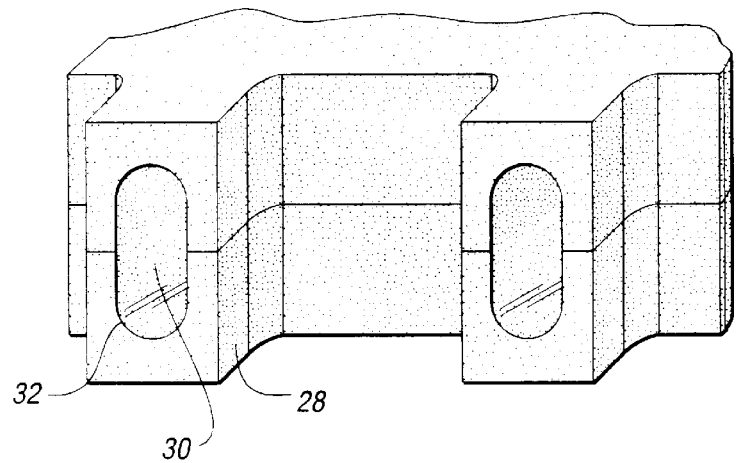

MOLTEN SOLDER DISPENSING SYSTEM

This is a divisional of application(s) Ser. No. 08/649,750 filed on May 15, 1996, now U.S. Pat. No. 5,746,368.

TECHNICAL FIELD

The present invention relates to soldering systems, and more particularly to nozzle body configurations for solder dispensing improvement.

BACKGROUND OF THE INVENTION

Typically, solder dispensing operations include a pump in communication with a nozzle for dispensing solder onto a workpiece. The solder may either be sprayed through the nozzle by means of the pump, or may be dispensed via gravity through the nozzle.

A common problem in fine-pitch soldering operations is lack of effective control of the dispensed solder. A single nozzle with a large dispenser opening results in a difficult-to-control operation. Attempts to provide a series of nozzles in close proximity to each other have been abandoned due to the tendency of adjacent solder droplets to coalesce, thereby causing inconsistency as the solder solidifies in its desired position. Droplets left over at the end of the nozzle between dispensing operations may, due to surface tension effects, stick to the nozzle and spread and coalesce with adjacent droplets from nearby nozzles.

A further problem experienced with prior art soldering operations is the inability to sufficiently inert the dispenser area, which results in oxidation and premature solidification of the solder. This oxidation can adversely affect the ability of the solder to stick to the workpiece. It is desirable to provide a solder dispensing system which improves inerting of the dispenser area.

It is further desirable to provide a solder dispensing system in which solder can be accurately and evenly applied to a workpiece in a manner in which solder flow is accurately controlled for smooth dispensing.

DISCLOSURE OF THE INVENTION

The present invention overcomes the above-referenced shortcomings of prior art solder dispensing assemblies by providing a micro-machined nozzle body with a plurality of flow channels formed therein for directing flow of solder. A nipple is provided at the end of each flow channel for preventing coalescence between adjacent channels. A shielding chamber is provided in communication with each flow channel for protecting the respective nipple and for guiding flow of the solder. Various flow channel configurations are provided for improving flow characteristics.

More specifically, the present invention provides an apparatus for dispensing solder, comprising a pump for pumping solder, and a nozzle body having a plurality of flow channels formed therein. Each flow channel includes an inlet end in fluid communication with the pump and a dispenser end for dispensing solder. The nozzle body forms a nipple surrounding each dispenser end. The nozzle body further forms a shielding chamber in communication with each dispenser end for protecting the respective nipple.

More specifically, the present invention provides an apparatus for dispensing solder including a nozzle body having a plurality of substantially parallel flow channels formed therein. Each flow channel includes an inlet end and a dispenser end. The dispenser ends form a row.

In various embodiments, the flow channels are provided with tapered side walls, undulating side walls, and polygonal and non-circular cross-sections.

In a further embodiment, the nozzle body includes at least one gas feeder channel in fluid communication with each shielding chamber for dispensing an inert gas into the shielding chamber for preventing premature solidification and oxidation of the solder.

Accordingly, an object of the present invention is to provide an improved apparatus for dispensing solder in which uniformity and accuracy of solder flow is improved, and coalescence between adjacent solder flow channels is eliminated.

A further object is to reduce or eliminate the formation of residual droplets at the end of the nipple.

The above object and other objects, features, and advantages of the present invention are readily apparent from the following detailed description of the best modes for carrying out the invention when taken in connection with the accompanying drawings.

BRIEF DESCRIPTION OF THE DRAWINGS

FIG. 7 shows an enlarged view of the nozzle body half taken from FIG. 6;

FIG. 8 shows a cut-away perspective view of the nozzle body portion shown in FIG. 7;

FIG. 9 shows a cut-away perspective view of a third embodiment of a nozzle body in accordance with the present invention;

DETAILED DESCRIPTION OF THE PREFERRED EMBODIMENTS

Figure 1:
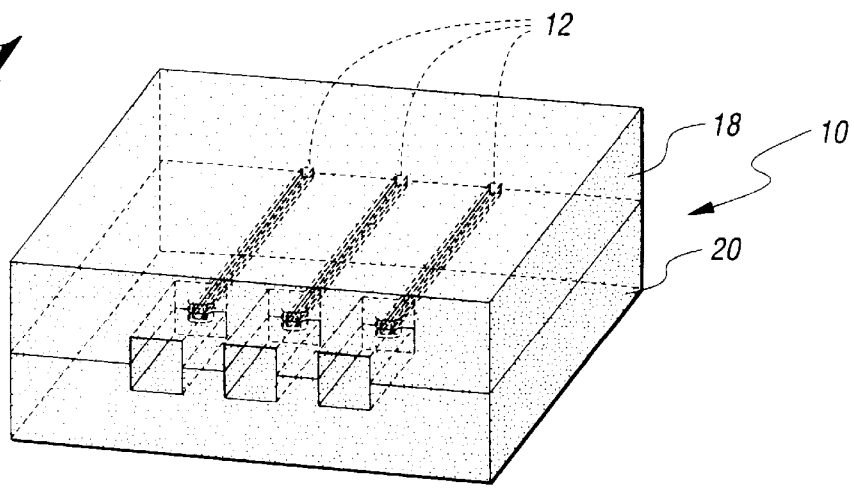
FIG. 1 shows a perspective view of a nozzle body in accordance with the present invention.
Figure 2:
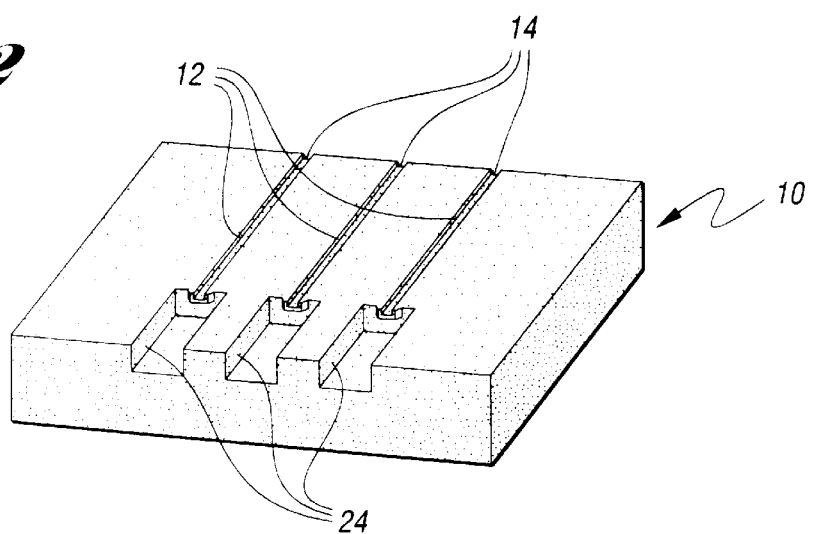
FIG. 2 shows a perspective view of a nozzle body half taken from FIG. 1 in accordance with the present invention.
Figure 3:
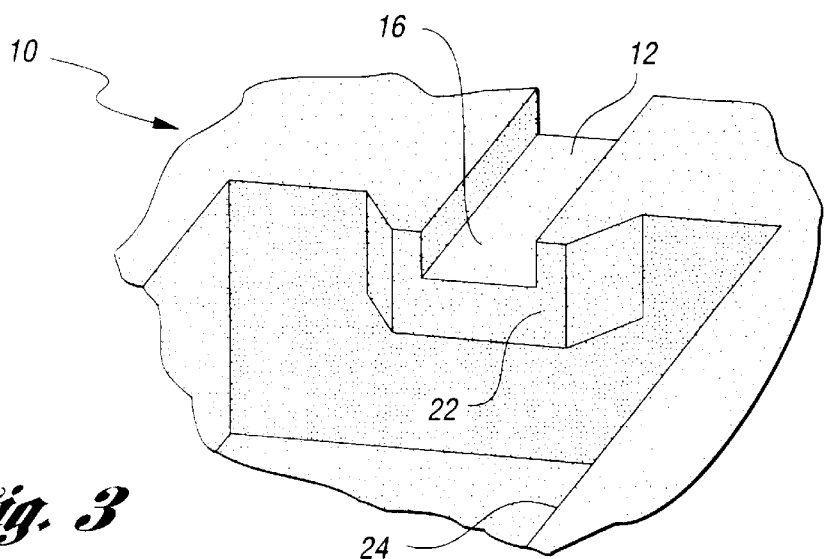
FIG. 3 shows an enlarged view of the body half shown in FIG. 2.
Figure 4:
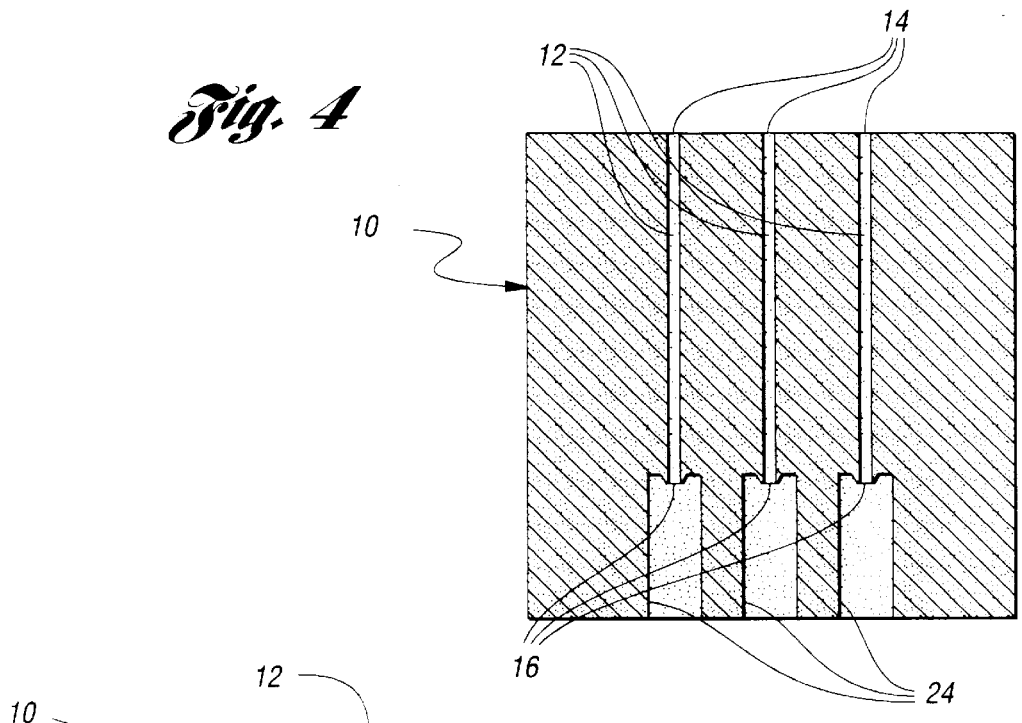
FIG. 4 shows a sectional side elevational view of the nozzle body half shown in FIG. 2.
Figure 5:
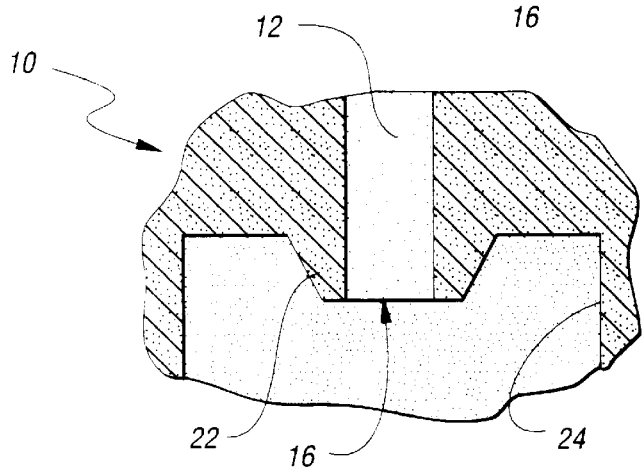
FIG. 5 shows an enlarged view of the body half shown in FIG. 4.

A nozzle body 10 is shown in accordance with the present invention in FIGS. 1–5. The nozzle body 10 includes a plurality of flow channels 12 formed therein. Each flow channel includes an inlet end 14 and a dispenser end 16. The nozzle body 10 is comprised of first and second body halves 18,20 formed of silicon. The flow channels are micro-machined into the body halves 18,20.

Coalescence at the dispenser ends 16 is greatly reduced or eliminated by micro-machining fragile nipples 22 surrounding the dispenser ends 16. In order to protect the fragile nipples 22, a shield chamber 24 is provided surrounding each nipple 22 for protection during handling. Of course, the nipple can be formed in various different geometries. The accurate dispensing of molten solder from the dispenser ends 16 is significantly enhanced by forcing the solder through the protective shield chambers 24. The diameter of the shield chambers is much larger than the exit diameter of the dispenser ends. Therefore, the solder does not fill the entire cross-section of the shield chambers 24, but emanates from the dispenser ends 16 in the form of a continuous stream of drops.

Sometimes, possibly due to imperfections in the dispenser ends 16, the solder stream is slightly misdirected. With no corrective action, coalescence of neighboring streams could result. The walls of the protective shields 24 provide redirection of the stream, much like the barrel of a shotgun, preventing coalescence and forcing the stream to the desired location. The walls of the shield chambers 24 are non-wetting to solder, therefore the streams tend to deflect off and continue on a path aimed almost vertically downward. In addition, the walls physically separate the dispenser ends 16, avoiding coalescence of neighboring streams at the dispenser ends 16.

Figure 6:
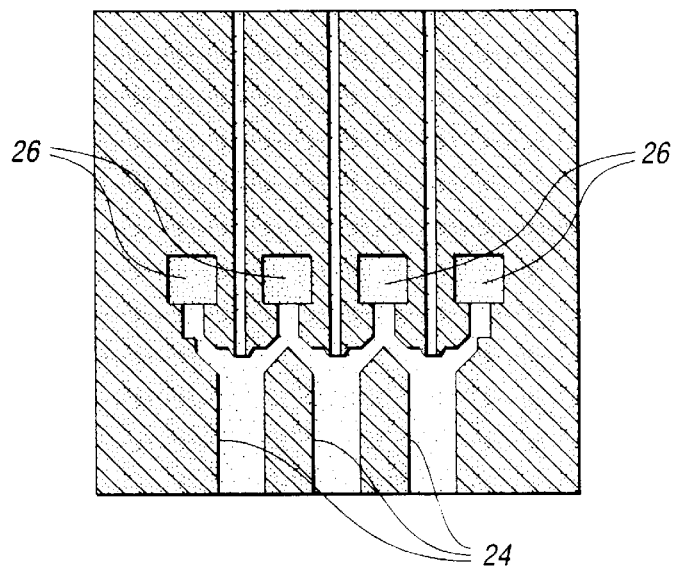
FIG. 6 shows a sectional side elevational view of a nozzle body half in accordance with a second embodiment of the present invention.

Maintaining a low oxygen concentration at the dispenser ends 16 of the flow channels 12 is critical for consistent dispensing. An additional optional feature of the invention includes gas feeder channels 26 opening into the protective shield chambers 24 to supply the chambers with inert gas, as shown in the second embodiment illustrated in FIGS. 6–8. The gas feeder channels 26 are fabricated into the micro-machined nozzle body 10. This feature of the system will inert the dispensed solder as it discharges from the dispenser ends 16. The nitrogen, or other inert gas, introduced into the protective shield chambers 24 flows away from the dispenser ends 16 and exits the shield chambers 24, thus creating an additional barrier against diffusion of oxygen from the ambient.

The nozzle bodies are fabricated using a novel combination of silicon micro-machining techniques which might include isotropic and anisotropic wet chemical etching, plasma or reactive ion etching, deep boron diffusion, sacrificial wafer processing, epitaxial silicon growth, passivation film deposition, wafer bonding, chemical mechanical wafer polishing, and electrochemical etching. The result is a three-dimensional network of microchannels, manifolds, ports, and nippled dispenser ends for dispensing of molten solder and inert nitrogen gas.

Thus, the protected dispenser ends 16 have several advantages over unprotected ones. The walls of the protective shields provide a "shotgun-like" direction of the molten solder jet, preventing coalescence with neighboring jets at the orifices and insuring pin-point dispensing accuracy. The fragile dispenser end nipples 22 are well protected against damage during handling. The protective chamber 24 provides an additional barrier against oxygen diffusion toward the solder dispenser ends 16. The inert gas introduced directly into the protective shields 24 forces oxygen away from the dispenser ends 16, which provides an additional barrier to oxygen transport.

The flow channel 12 cross-section may be polygonal or smooth circular, or quadrilateral with rounded corners. The sharp corners of polygonal cross-sections do not permit non-wetting fluids to fill the entire area. Thus, during dispense, the cross-section along the entire column of fluid below the reservoir stays in partial contact with the surrounding gas. In some instances, this could cause inconsistent pinch-off of the fluid column at one or more locations, occasionally leaving behind slugs of fluid in the channels after dispense. Smooth shapes provide less propensity for slug formation and hence provides more consistent dispensing.

Of course, the flow channels 12 could be made tapered or converging, and the taper could be curved, undulating, etc. This serves to possibly locate the solder interface within the channels, as well as improve the flow characteristics of the solder jet.

FIG. 9 shows a perspective view of an alternative nipple arrangement in which the flow channel 30 at the dispenser end 32 is provided with an oval-shaped cross-section. In this embodiment, the nipple 28 is approximately 10–30 microns in length and the nipple walls are 5–15 microns in width. Of course, these dimensions could vary.

Figure 11:
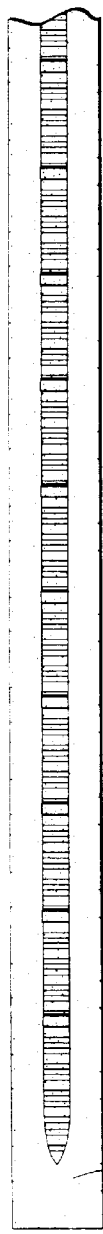
FIG. 11 shows a top plan view of the nozzle body shown in FIG. 10 looking down the throat of the nozzle body.
Figure 10:
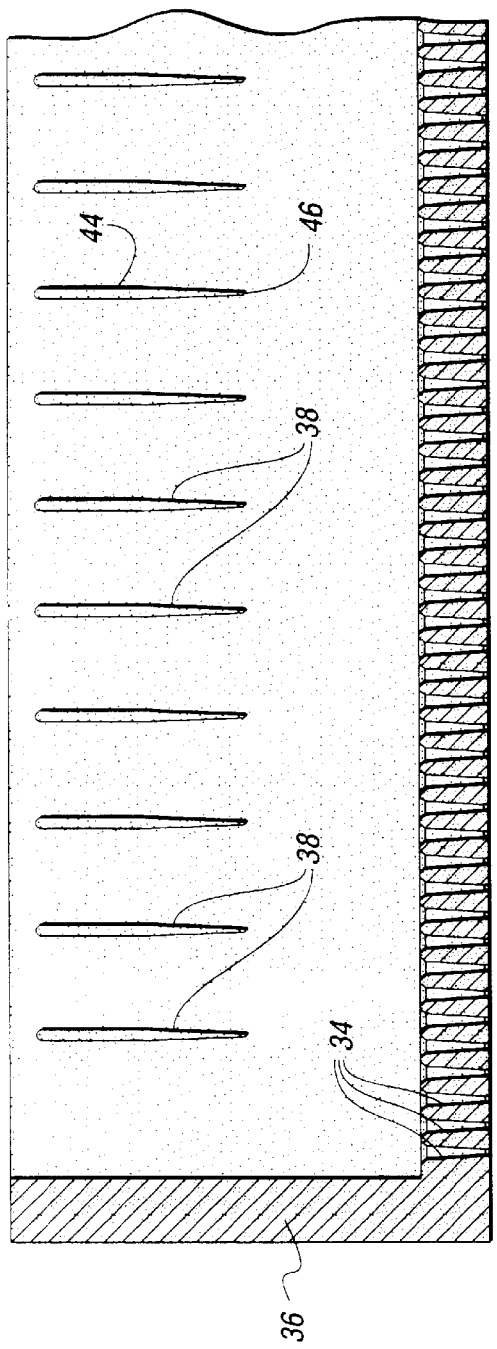
FIG. 10 shows a vertical cross-sectional view of a fourth alternative embodiment of a nozzle body in accordance with the present invention.
Figure 12:
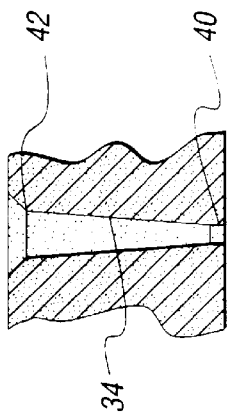
FIG. 12 shows an enlargement taken from FIG. 10.

FIGS. 10–12 illustrate geometry of a welled silicon wafer containing a row of flow channels 34 in accordance with a fourth alternative embodiment of the present invention. The welled wafer 36 allows the use of short flow channels 34 while maintaining a longer length of wafer for ease in mounting the wafer onto the dispense head. The short flow channels limit the equilibrium location of the fluid interface within the channels 34 after dispense, thereby creating better volume control for successive dispenses. The welled portion of the wafer 36 contains aerodynamic support struts 38 to provide strength to the wafer 36 with minimal disturbance to flow. In a preferred embodiment, the flow channels 34 are 80 microns in diameter at the dispenser end 40, 240 microns in diameter at the inlet end 42, and 1600 microns in length from the inlet end 42 to the dispenser end 40. The support struts 38 are preferably 4000 microns in length, with a body portion 44 having a width of 200 microns which narrows down to a tip 46. Of course, this is merely a preferred embodiment and the dimensions could vary.

Figure 13:
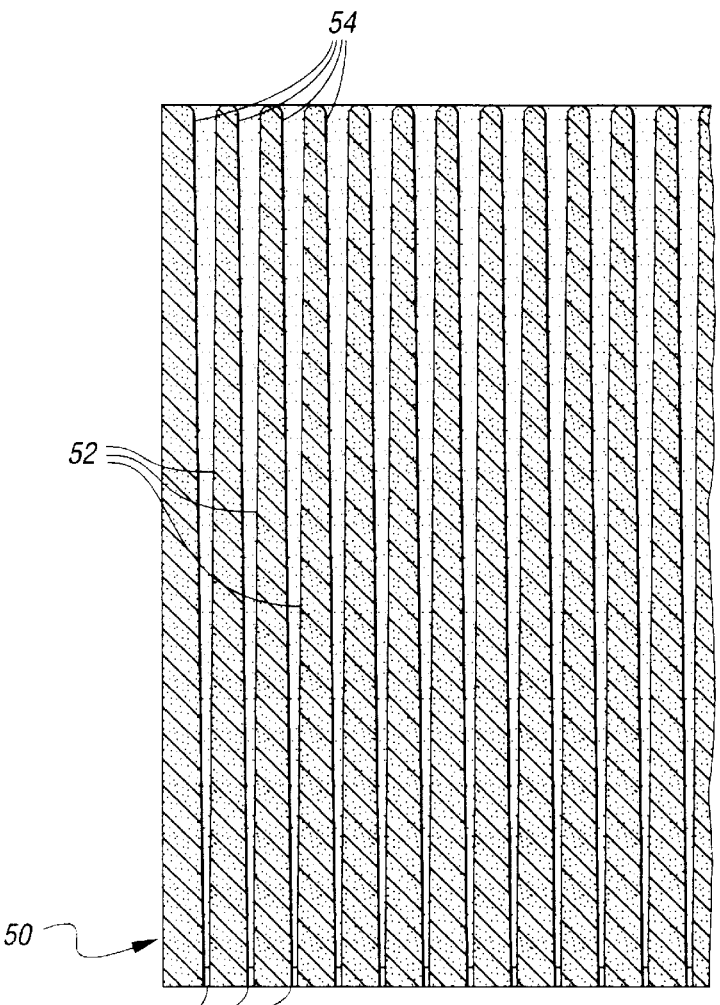
FIG. 13 shows a sectional view of a fifth alternative embodiment of a nozzle body in accordance with the present invention.

FIG. 13 illustrates a further alternative nozzle body 50 having flow channels 52 with converging cross-sections in accordance with a fifth alternative embodiment. The convergence could be a taper or other cone of arbitrary shape. The converging contour suppresses instabilities in the flow, and accelerates the flow through the channels 52 thereby minimizing the exit boundary layer. The converging channels 52 may also be designed to confine the equilibrium location of the interface after dispense to a predetermined region. The design is based on the consideration that, after dispense, the interface will come to rest at a location where the surface tension forces (determined by local channel cross-section) and static pressure forces are in balance. Confined equilibrium interface locations consistent among all channels and successive dispense operations result in consistent dispensing of controlled solder volumes. In the embodiment shown in FIG. 13, the inlet ends 54 are preferably 200 microns in diameter, and the dispenser ends 56 are preferably 55 microns in diameter. Further, the flow channels 52 are preferably 9000 microns in length.

Figure 14:
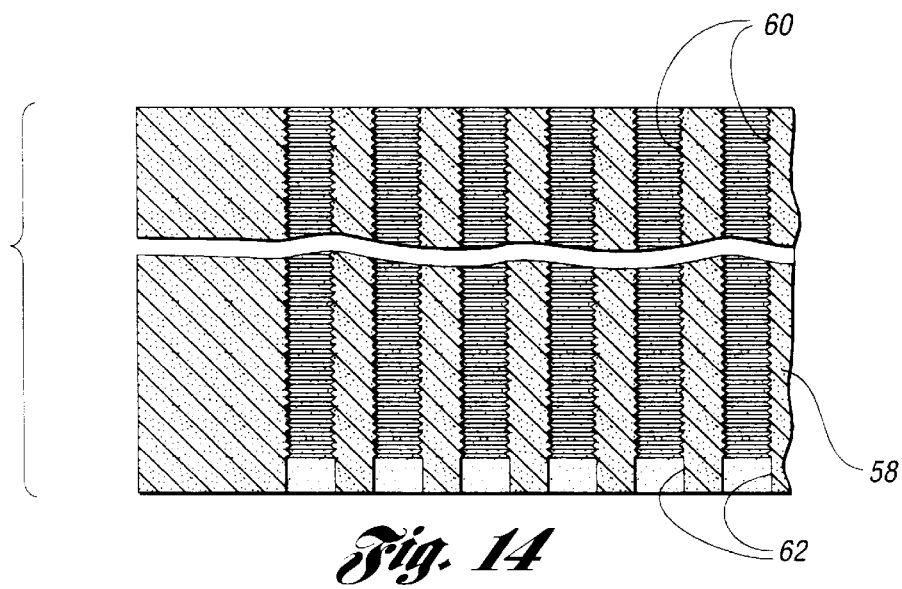
FIG. 14 shows a cut-away sectional view of a nozzle body flow channel in accordance with a sixth alternative embodiment of the present invention.

FIG. 14 shows yet another alternative nozzle body 58 with undulated flow channel walls 60 in accordance with a sixth alternative embodiment. These undulations create pressure perturbations which generate disturbances having a large wave number. These disturbances modulate the environmental acoustic noise which is responsible for the generation of instabilities in the flow. If the modulated disturbances are such that their wave numbers are large enough, the growth of these environmental disturbances will be suppressed. Preferably, the undulations have a height equal to $\frac{1}{10}$ of the diameter of the dispenser end 62, and a frequency width equal to $\frac{14}{100}$ of the diameter of dispenser end 62. Of course, as with all other embodiments, this embodiment could be combined with any of the other embodiments, and the flow channel could be tapered.

During the dispense operation, in order to prevent the solder from clinging to the dispenser end of the nozzle body, which would result in coalescence with neighboring fluid streams and inconsistent dispensing, nipples are provided as described above.

Figure 15:
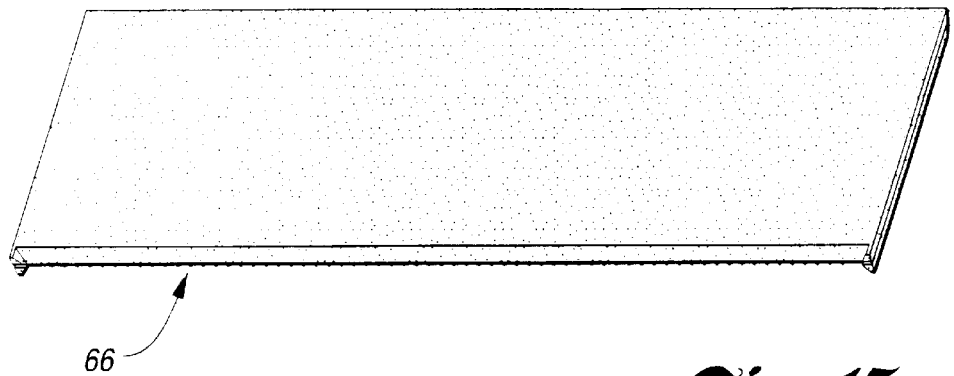
FIG. 15 shows a perspective view of a nozzle body in accordance with a seventh alternative embodiment of the present invention.
Figure 16:
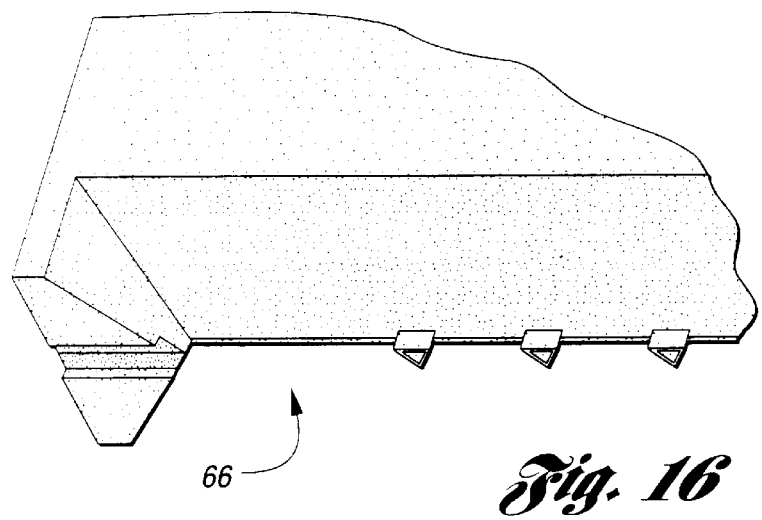
FIG. 16 shows an enlargement taken from detail 16 of FIG. 15.
Figure 17:
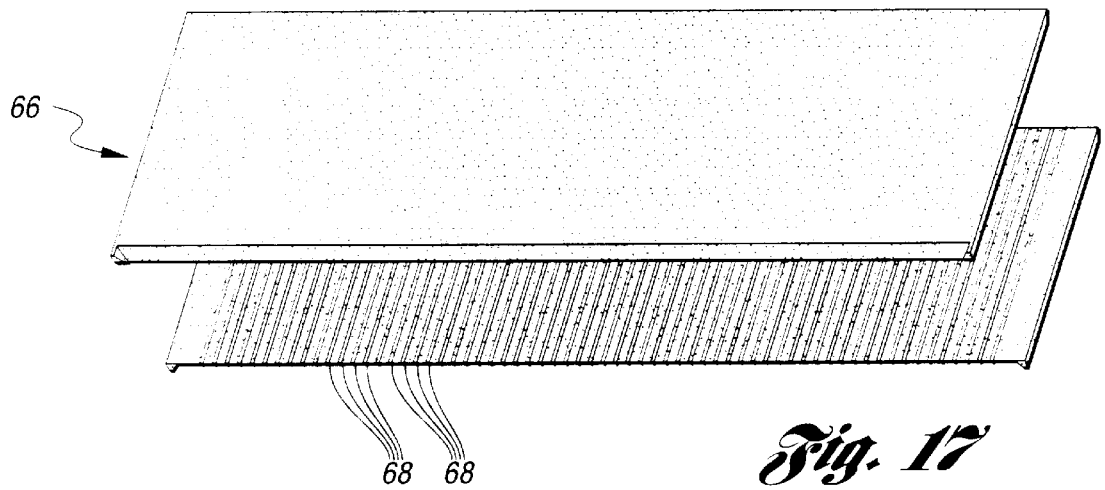
FIG. 17 shows an exploded perspective view of the nozzle body shown in FIG. 15.

The embodiment illustrated in FIGS. 15–17 shows a further nozzle body embodiment 66 in which the flow channels 68 include no protective shield in accordance with a seventh alternative embodiment. Of course, the nipple can be formed in various different geometries.

While the best modes for carrying out the invention have been described in detail, those familiar with the art to which this invention relates will recognize various alternative designs and embodiments for practicing the invention within the scope of the appended claims.

What is claimed is:

1. An apparatus for dispensing solder, comprising a nozzle body having a plurality of substantially parallel flow channels formed therein, each flow channel having an inlet end and a dispenser end having a dispenser end diameter, said dispenser ends forming a row, and wherein the flow channels include side walls having undulations along the length thereof, said undulations having a height equal to approximately $\frac{1}{10}$ of the diameter of the dispenser end and a frequency width equal to approximately $\frac{14}{100}$ of the diameter of the dispenser end.

* * * * *